(12) United States Patent
Altug et al.

(10) Patent No.: US 7,206,488 B1
(45) Date of Patent: Apr. 17, 2007

(54) COUPLED PHOTONIC CRYSTAL RESONATOR ARRAY ARRANGEMENTS AND APPLICATIONS

(75) Inventors: Hatice Altug, Stanford, CA (US); Jelena Vuckovic, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 17 days.

(21) Appl. No.: 10/946,774

(22) Filed: Sep. 22, 2004

(51) Int. Cl.
*G02B 6/10* (2006.01)
(52) U.S. Cl. ............. 385/131; 385/130; 385/132; 385/129
(58) Field of Classification Search ......... 385/129–132
See application file for complete search history.

(56) References Cited

U.S. PATENT DOCUMENTS

| | | | |
|---|---|---|---|
| 6,416,575 B2 * | 7/2002 | Yamada | 117/2 |
| 6,468,823 B1 * | 10/2002 | Scherer et al. | 438/31 |
| 2004/0062505 A1 * | 4/2004 | Sugitatsu et al. | 385/131 |
| 2005/0200942 A1 * | 9/2005 | Grot et al. | 359/321 |
| 2006/0147169 A1 * | 7/2006 | Sugita et al. | 385/129 |

OTHER PUBLICATIONS

Yariv et al., "Coupled-resonator optical waveguide: a proposal and analysis", Optics Letters vol. 24, No. 11 (Jun. 1, 1999).
Hatice Altug and Jelena Vuckovic, "Two-dimensional coupled photonic crystal resonator arrays," Applied Physics Letters, vol. 84, No. 2, Jan. 12, 2004.
Bayindir et al., "Tight-binding description of the coupled defect modes in three-dimensional photonic crystals", Physical Review Letters, vol. 84, Issue 10, pp. 2140-2143, Mar. 6, 2000. (Abstract only).
Olivier et al., "Miniband transmission in a photonic crystal coupled-resonator optical waveguide", Opitcs Letters, vol. 26, Issue 13, pp. 1019-1021, Jul. 2001. (Abstract only).
Happ et al., "Two-dimensional photonic crystal coupled-defect laser diode", Applied Physics Letters, vol. 82, Issue 1, pp. 4-6, Jan. 6, 2003. (Abstract only).
Painter et al., "Two-dimensional photonic band-gap defect mode laser", Science, vol. 284, pp. 1819-1821, Jun. 11, 1999.
Hwang et al., "Room-temperature triangular-lattice two-dimensional photonic band gap lasers operating at 1.54 μm", Applied Physics Letters, vol. 76, Issue 21, pp. 2982-2984, May 22, 2000. (Abstract only).

(Continued)

*Primary Examiner*—Frank G. Font
*Assistant Examiner*—Eric Wong
(74) *Attorney, Agent, or Firm*—Crawford Maunu PLLC (57) ABSTRACT

Light is processed and, in some instances, generated using an approach involving a photonic crystal resonator arrangement. According to an example embodiment, a photonic crystal resonator array includes an array of defect locations configured for controlling the group velocity of light passing through the photonic crystal resonator array. In one implementation, holes are selectively formed in a membrane, with certain periodic locations in the membrane being substantially free of holes. In other implementations, certain periodic locations as discussed above are characterized by holes having a relatively differently-shaped opening, relative to a plurality of the holes. Still other implementations involve optical delay components, lasers, sensors and other devices implemented with a photonic crystal resonator array.

32 Claims, 9 Drawing Sheets

OTHER PUBLICATIONS

Loncar et al., "Low-threshold photonic crystal laser", Applied Physics Letters, vol. 81, Issue 15, pp. 2680-2682, Oct. 7, 2002. (Abstract only).

Yoshie et al., "High frequency oscillation in photonic crystal nanolasers", Applied Physics Letters, vol. 84, Issue 18, pp. 3543-3545, May 3, 2004. (Abstract only).

Altug et al., "Experimental demonstration of the slow group velocity of light in two-dimensional coupled photonic crystal microcavity arrays", http://www.arxiv.org/abs/physics/0406109, Jun. 24, 2004.

Elliott et al., "Polarization control of optical transmission of a periodic array of ellipitcal nanoholes in a metal film", Optics Letters, vol. 29, Issue 12, pp. 1414-1416, Jun. 2004. (Abstract only).

Gordon et al., "Strong polarization in the optical transmission through elliptical nanohole arrays", Physical Review Letters, vol. 92, 037401, Jan. 23, 2004. (Abstract only).

Lousse et al., "Angular and polarization properties of a photonic crystal slab mirror", Optics Express, vol. 12, No. 8, Apr. 19, 2004.

Chow et al., "Ultracompact biochemical sensor built with two-dimensional photonic crystal microcavity", Optics Letters, vol. 29, Issue 10, pp. 1093-1095, May 2004. (Abstract only).

Loncar et al., "Photonic crystal laser sources for chemical detection", Applied Physics Letters, vol. 82, Issue 26, pp. 4648-4650, Jun. 30, 2003. (Abstract only).

Painter et al., "Lithographic tuning of a two-dimensional crystal laser array", IEEE Photonics Technology Letter, vol. 12, No. 9, Sep. 2000.

John, "Strong localization of photons in certain disordered dielectric superlattices", Physical Review Letters, vol. 58, No. 23, Jun. 8, 1987.

Yablonovitch, "Inhibited spontaneous emission in solid-state physics and electronics", Physical Review Letters, vol. 58, No. 20, May 18, 1987.

\* cited by examiner

COUPLED PHOTONIC CRYSTAL RESONATOR ARRAY ARRANGEMENTS AND APPLICATIONS

FIELD OF THE INVENTION

The present invention relates generally to crystal structures and more particularly to the use and implementation of photonic crystal structures with light.

BACKGROUND

A variety of applications seek to control and/or manipulate the propagation of electromagnetic radiation and many applications are specifically directed to the manipulation and control of light propagation. For instance, lasers, optical delay components, sensors, non-linear optical devices and others manipulate light for use in many different applications.

One approach to manipulating light involves the use of crystalline structures and, more particularly, photonic crystals. Photonic crystals are structures typically implemented with dielectric type materials and are used to manipulate the propagation of light in certain applications. In many applications, photonic crystals are implemented with artificial multidimensional periodic structures having periodic variations in dielectric constant, with a period of the order of optical wavelength. These periodic structures tend to prohibit light from propagating under certain conditions. Photonic crystals can be implemented for defining a path for light that can bend sharply with low loss, for facilitating the localization of light and/or for defining small optical cavities for laser applications.

Achieving slow (or small) group velocity is useful in a variety of applications, ranging from optical delay components and low-threshold lasers, to sensors and the study of nonlinear optics phenomena.

Photonic crystals have been employed for achieving slow group velocities of light at electromagnetic band edges of the crystals. However this approach can be used to achieve slow group velocity for a relatively narrow range of wave vectors in a particular direction. This approach causes a generally large variation of group velocity with a wave vector (i.e., group velocity dispersion) and as a result leads to distortion in the shape of an optical pulse propagating through the structure.

Coupled resonator optical waveguides (CROWs) are structures that have been proposed for reducing group velocity. See, e.g., Yariv et al., *Coupled-resonator optical waveguide: a proposal and analysis*, Optics Letters Vol. 24, No. 11 (Jun. 1, 1999). In this case, adjacent defect cavities exhibit electromagnetic fields that couple with one another (due to evanescent Bloch waves), and a slow group velocity is achieved as a result of the tunneling of photons between the cavities. However, the reduction of group velocity is generally limited to a narrow region along the waveguide axis in which the cavities are coupled. As in the case of photonic crystal waveguides, the coupling into such a CROW structure is difficult, since the input (light) beam needs to be aligned in one particular direction.

These and other issues have been particularly challenging to the implementation of light in many applications, including applications involving the use of photonic crystals.

SUMMARY

The present invention is directed to overcoming the above-mentioned challenges and others related to the types of devices and applications discussed above and in other applications. These and other aspects of the present invention are exemplified in a number of illustrated implementations and applications, some of which are shown in the figures and characterized in the claims section that follows.

Various aspects of the present invention are applicable to an approach involving a crystalline material with an array of resonators characterized by hole locations with periodic inconsistencies. Such a structure can be used to control the group velocity of light passing in the crystalline material.

According to another example embodiment of the present invention, a photonic crystal device includes a substrate and a (e.g., two-dimensional) photonic crystal resonator array. In many instances, such a resonator array may be referred to as a Coupled Photonic Crystal Resonator Array (CPCRA). The resonator array includes a membrane having an arrayed pattern of hole locations, with the membrane defining the hole locations and with periodic inconsistencies introduced into hole patterns; such inconsistencies characterize locations of resonators inside the array. The resonator array is adapted, with the substrate, to control the group velocity of light propagating in an arbitrary crystalline direction of the structure.

According to another example embodiment of the present invention, a laser includes a photonic crystal resonator array configured and arranged for controlling the type of light (e.g., the group velocity of light) passed through this array. A membrane is implemented with an arrayed pattern of hole locations including a plurality of holes, and contains an embedded active layer, such as multi-quantum wells, where a stimulated emission of photons occurs. Each hole has boundaries defined by the membrane, with periodic ones of the hole locations having an inconsistency such as a differently-shaped hole or no hole at all. A membrane is suspended over a substrate, and a low-refractive index layer (such as air, oxide, etc.) is placed between the membrane and the substrate, (e.g., to provide a vertical confinement of light in the membrane). An excitation source is arranged and adapted to excite a portion of the active layer into emitting photons, and the photonic crystal resonator array is configured and arranged to couple the emitted photons to output laser light. This coupling may involve, for example, directing a selected wavelength of the photons in a direction substantially perpendicular to a lateral direction of the arrayed pattern.

Other example embodiments are directed to sensor implementations of a photonic crystal resonator array, such as that discussed above.

Still other example embodiments are directed to an optical delay device that uses a photonic crystal resonator array to cause a delay for optical signal, relative to an optical signal that is not interacting with a photonic crystal resonator array.

The above summary is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention that follows in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is believed to be applicable to a variety of different types of devices and processes, and the invention has been found to be particularly suited for controlling the group velocity of light. While the present invention is not necessarily limited to such applications, various aspects of the invention may be appreciated through a discussion of various examples using this context.

According to an example embodiment of the present invention, two-dimensional arrays of coupled photonic crystal resonators are configured to exhibit flat electromagnetic bands in all crystalline directions (i.e., electromagnetic bands whose frequency variation with a wave vector is minimized in all directions in a plane in which the arrays are arranged). These relatively flat electromagnetic bands are implemented to reduce the group velocity of light propagating through the resonators, over an entire range of optical wave vectors. Relative to a particular mode (corresponding, e.g., to a field pattern for a particular resonant frequency), group velocity in this context refers generally to the speed at which an electromagnetic field coupled to this particular mode propagates through the resonators. This approach to reducing group velocity is implemented to generally minimize the distortion of an optical pulse propagating through the structure, and to increase the density of optical states. This approach has been found useful for reducing the power threshold of nonlinear optical processes and lasing.

In some implementations, the arrays of coupled photonic crystal resonators are implemented with a two-dimensional or three-dimensional arrangement of resonators exhibiting evanescent electromagnetic field coupling in all crystalline directions. In this regard, the mode of each resonator in the array is coupled, with electromagnetic waves being transmitted across the array. The resonant frequency of each resonator falls within the photonic bandgap (forbidden area) of the surrounding array structure, facilitating high quality (high-Q) optical modes. For more information regarding the coupling of electromagnetic bands across adjacent resonators in a one-dimensional chain, reference may be made to the above-discussed document entitled *Coupled-resonator optical waveguide: a proposal and analysis*, which is fully incorporated herein by reference.

In another example embodiment of the present invention, a coupled photonic crystal resonator array (CPCRA) is employed to build low-threshold photonic crystal lasers to facilitate desirable output power. The CPCRA includes periodic defects that act together to generate coupled electromagnetic fields across the array to reduce group velocity in generally any photonic crystal direction. This reduction in group velocity is implemented to achieve relatively high output power while preserving a generally low lasing threshold (the lowest excitation power level at which a laser's output is mainly the result of stimulated emission rather than spontaneous emission). For example, a particular mode can be localized in the photonic band gap of the resonator array (as set by defect type and periodicity) to reduce group velocity (i.e., increase the density of optical states), thereby reducing lasing threshold. In addition, the radiative decay time of carriers is also reduced, facilitating a laser that can be modulated at very high speeds. In various implementations, this approach is further implemented with the construction of efficient light-emitting diodes (solid-state light sources), that generally operate below the lasing threshold for stimulated emission and employ a relatively high spontaneous emission rate, achievable in CPCRAs.

In connection with some embodiments discussed herein and as mentioned above, the term "spontaneous emission" generally refers to radiation emitted when a quantum mechanical system drops spontaneously from an excited level to a lower level, followed by an emission of photon with energy about equal to the difference between the initial and the final state. This radiation is emitted according to the laws of probability without necessary regard to the simultaneous presence of similar radiation. The rate of spontaneous emission is proportional to the Einstein "A" coefficient and is inversely proportional to the radiative lifetime.

Also in connection with some embodiments discussed herein and as mentioned above, the term "stimulated emission" refers to radiation that is similar in origin to spontaneous emission but is determined by the presence of other radiation having the same frequency. The phase and amplitude of the stimulated wave depend on the stimulating wave; thus, this radiation is coherent with the stimulating wave. The rate of stimulated emission is proportional to the intensity of the stimulating radiation.

In another example embodiment, arrays of coupled photonic crystal resonators are adapted for the exploration of nonlinear optical effects (e.g., solitons) and/or the construction of optical switching arrays resulting from the optical delay of pulses propagating through the arrays.

According to another example embodiment of the present invention, CPCRAs are constructed by periodically modifying array locations in a photonic crystal slab. These modified locations may be formed, for example, by forming generally consistent openings in the slab and, at periodic locations, introducing an opening having a different size and/or shape than the generally consistent openings or, in some instances, eliminating an opening altogether. The crystal slab is suspended over a substrate in a manner that facilitates the passage of light through resonators in the crystal slab. Electromagnetic bands that couple with modified locations are thereby formed and exhibit generally low group velocity.

Figure 1:
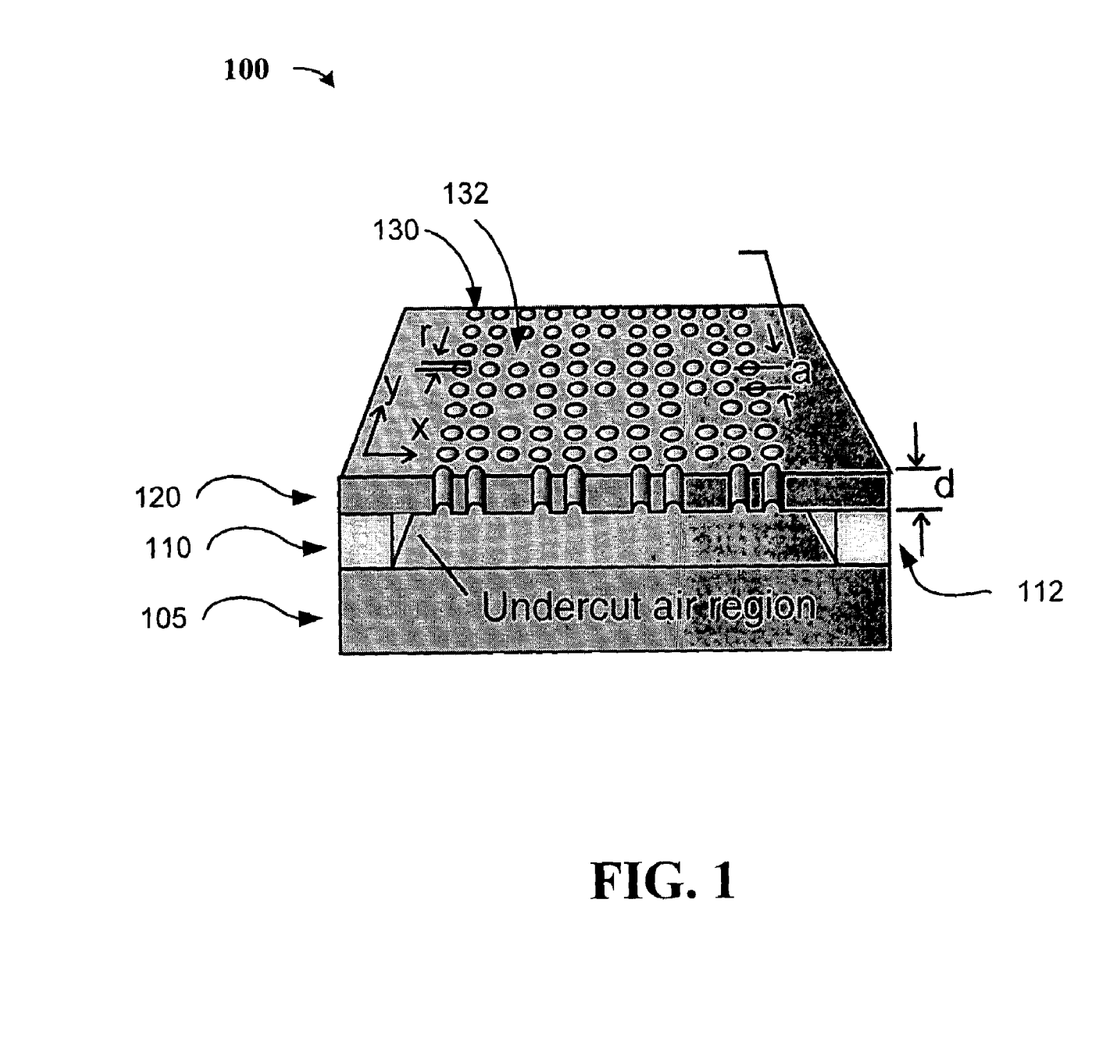
FIG. 1 shows a cross-sectional view of a photonic crystal resonator array including a membrane suspended over a substrate, according to an example embodiment of the present invention.

FIG. 1 shows a two-dimensional CPCRA 100 having a repeating defect structure that facilitates electromagnetic field coupling across the CPCRA, according to another example embodiment of the present invention. The CPCRA 100 includes a membrane 120 suspended over a substrate 105 by supporting structures 110 and 112. The membrane 120 and substrate are arranged such that an undercut air region exists between the membrane and substrate (facilitating, e.g., a guiding mechanism of light in silicon membrane 120 via air (having a relatively low refractive index) above and below the membrane.

The membrane 120 has a thickness represented by dimension "d," and is characterized by a plurality of lattice holes (e.g., 130) in an array. Every third lattice hole in two (x and y) perpendicular directions has been removed to create a defect location (e.g., 132), relative to locations in the array having a hole.

The thickness of the CPCRA 100 is selected to fit a particular implementation to which the CPCRA is applied. In one implementation, the CPCRA 100 includes a dielectric slab having a thickness of 0.55 a with a hole radius is of about 0.4 a, where "a" is the inter-hole spacing indicated in FIG. 1, with a refractive index of about n=3.5, corresponding to silicon at optical wavelengths. Coupled cavity bands are formed with adjacent tiled patterns of holes and defects as shown in the CPCRA 100.

In another implementation, the CPCRA structure 100 is formed using a silicon on insulator approach for an operating wavelength of about 1550 nm. The desired thickness of the silicon membrane 120 is set using wafer thermal oxidization followed by hydrofluoric (HF) wet etching of oxide formed in the thermal oxidation. Openings are patterned in the silicon membrane 120 by using polymethylmethacrylate (PMMA) layer (molecular weight of about 495 K) that is spun on the silicon membrane 120. The PMMA layer is baked on a hot plate at about 170° C. for about 30 min to create a PMMA layer having a thickness of about 320 nanometers. Electron-beam lithography is then performed (e.g., in a Raith 150 system at 10 keV) and the exposed PMMA is developed in 3:1 isopropyl alcohol IPA:MIBK mixture for about 50 seconds and rinsed in IPA for 30 seconds. Patterns are subsequently transferred to the silicon using a magnetically induced reactive ion etch with $HBr/Cl_2$ gas combination, forming the patterned openings shown in FIG. 1. After dry etching, remaining PMMA is removed by an $O_2$ plasma process. Finally, the oxide layer underneath silicon membrane 120 is removed by immersing the sample into the buffered HF, leaving behind portions 110 and 112 of the oxide layer and a freestanding silicon membrane 120.

The substrate material 105 is implemented with different types of materials, depending upon the implementation. In some instances, the substrate material 105 includes a silicon-based material. In other instances, the substrate material is an indium phosphide (InP) type material configured for applications such as those involving lasers. In addition, material having a lower refractive index than the membrane material 120 and the substrate material 105 can be inserted in between the membrane and substrate material and utilized for guiding light in the membrane material 120. For instance, air, which has the lower refractive index than the membrane material 120 and the substrate material 105, is used in FIG. 1.

The arrangement and/or shape of the holes are selected to fit a particular application for which the CPCRA is implemented. As shown in FIG. 1, each of the holes is spaced apart from other holes at about an equal distance (represented by distance "a"). However, in various implementations, the hole spacing is varied to suit the needs of the implementation. For instance, by varying the spacing in one or both of x and y (or other) directions, the band in which optical signals are passed can be tuned. Similarly, by selecting the shape of the holes, the band can also be tuned. For instance, the radius "r" of the hole can be increased or decreased, or the holes can be stretched or skewed. The position of a band through which light passes in the CPCRA is thus manipulated within the band gap. This approach increases or decreases the overlap of an electromagnetic field with an air region inside an individual resonator (e.g., in a hole), and leads to an increase or decrease in the mode frequency. In addition, the shown holes can be replaced with other openings having a variety of different shapes (e.g., oval). Each of these approaches is selectively implemented for tuning the band in which optical signals are passed for particular CPCRA functions.

Figure 2:
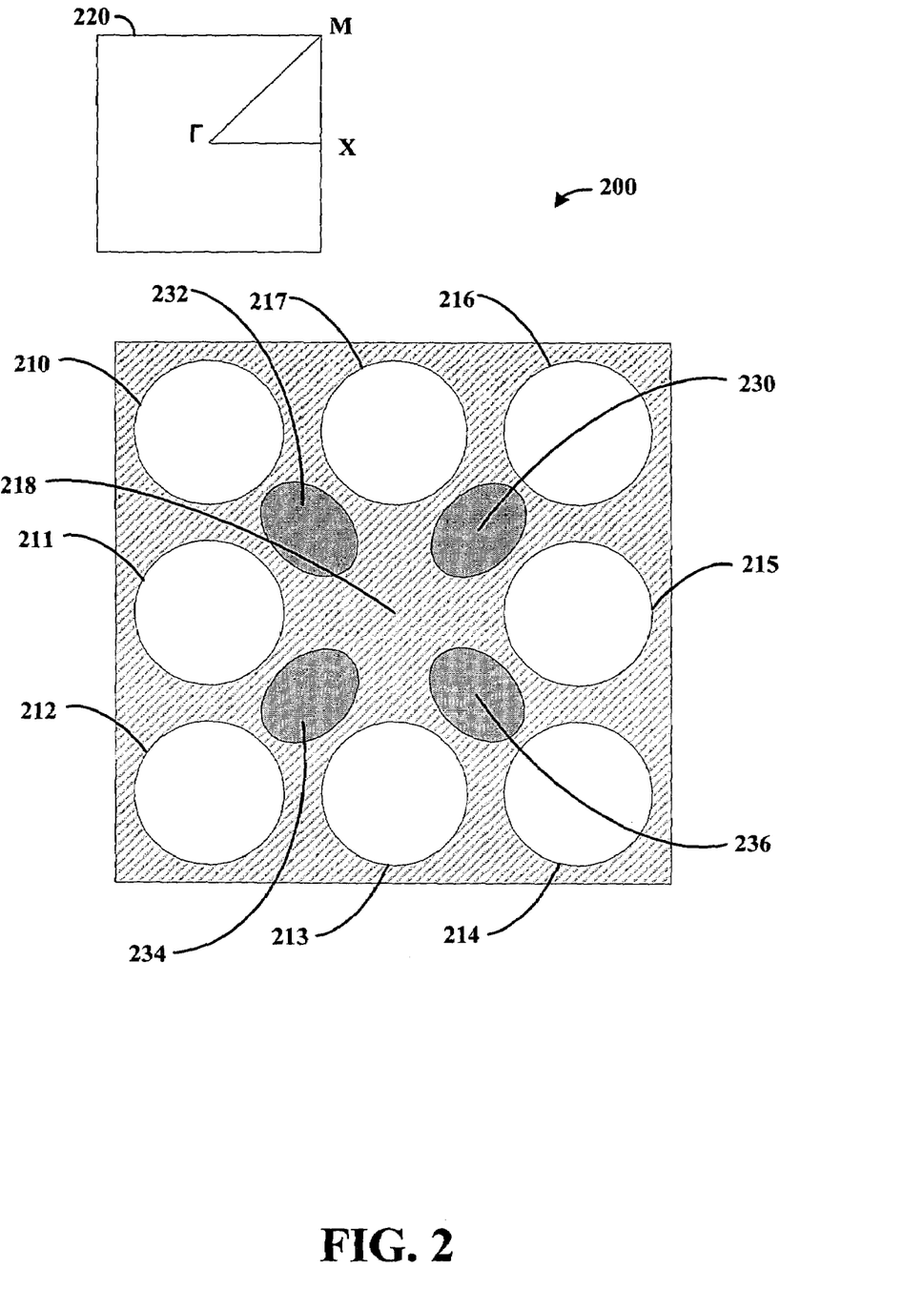
FIG. 2 shows a single unit cell resonator for use in a photonic crystal resonator array, according to another example embodiment of the present invention.

FIG. 2 shows a single unit cell resonator 200 for use with a repeating pattern of resonators in a generally square photonic crystal lattice, according to another example embodiment of the present invention. The resonator 200 has directions of high-symmetry points, Γ, X, and M as shown by legend 220. This unit cell 200 may be implemented, for example, in connection with the repeating defect structure used with the CPCRA 100 shown in FIG. 1 and discussed above. This structure can be implemented as a two-dimensional (2D) array of single-defect photonic crystal cavities formed by altering and/or removing a single air hole (i.e., by not forming an air hole). This structure supports three types of modes: doubly degenerate dipole, nondegenerate quadrupole, and nondegenerate monopole.

The single unit cell resonator 200 includes hole regions 210–217, with a central defect location 218. While referred here as a defect location, the defect location 218 generally refers to a location having a variation in the hole pattern (i.e., no hole), and does not necessarily imply that the lack of a hole is "defective" in the context of an undesirable characteristic.

Figure 3:
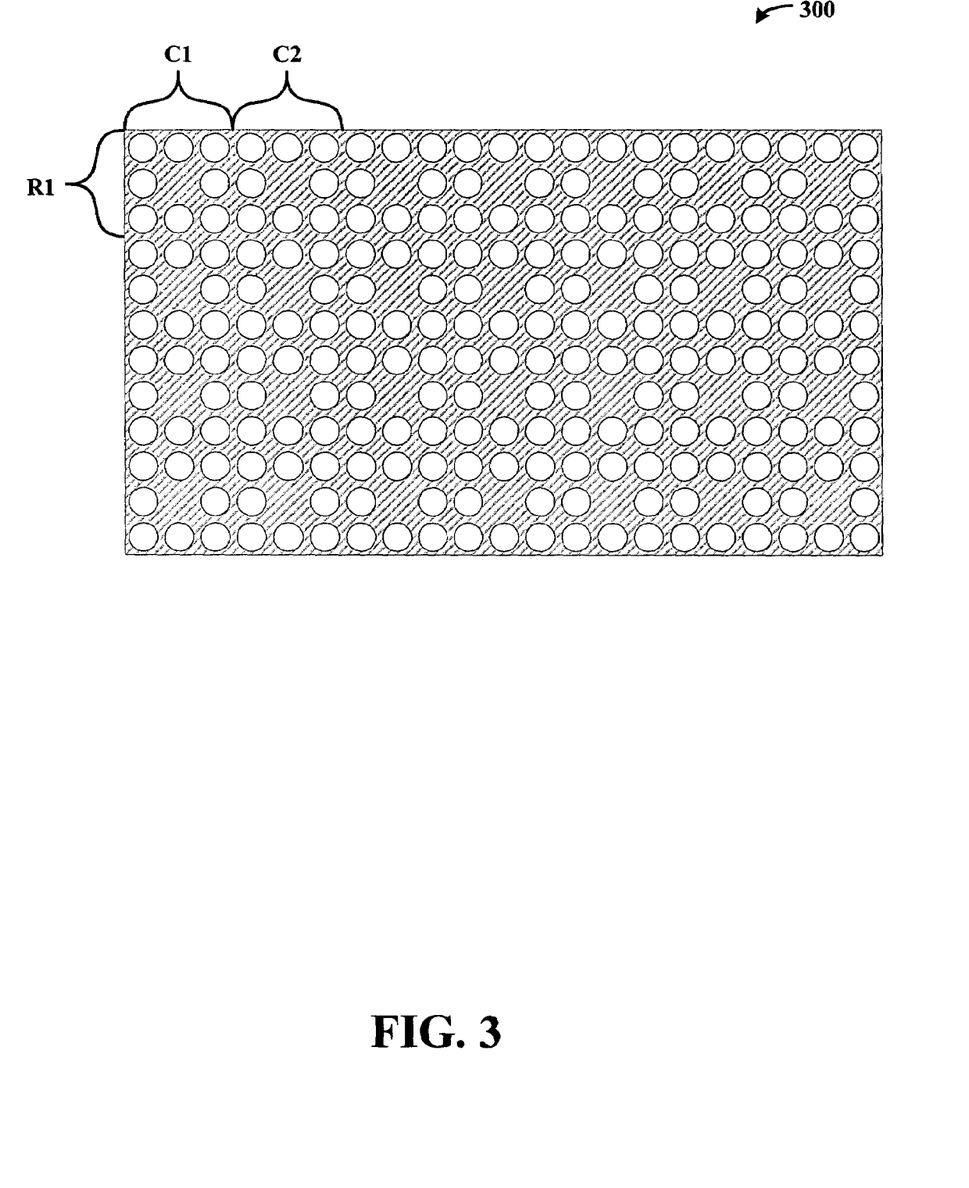
FIG. 3 shows a top view of an implementation for a multitude of single unit cell resonators, such as that shown in FIG. 2, according to another example embodiment of the present invention.

As the lattice perturbation increases (e.g., a modified, or defect, hole radius decreases), modes are pulled from the air or dielectric band and localized in the band gap. For example when the defect hole radius is decreased (e.g., as with a zero hole radius shown at defect location 218), the modes are pulled from the air band into the bandgap. The first mode to be localized in this process is the dipole, and the last is the monopole. In some implementations, the cavity mode with a desirable quality factor (Q-factor) is the quadrupole mode. Here, when implemented with the quadrupole mode, the resonator 200 exhibits magnetic field patterns as represented by regions 230, 232, 234 and 236. These bands are generally equal in four directions and couple generally equally to all adjacent resonators (i.e., when arranged in an array as shown in FIG. 3). In other implementations (e.g., where linear polarization is desirable) the dipole mode is localized and used; this mode exhibits a magnetic field pattern with two lobes (relative, e.g., to a quadrupole mode exhibiting four lobes) and is primarily linearly polarized.

FIG. 3 shows an array 300 of unit cell resonators, similar to the resonator 200 shown in FIG. 2, according to another example embodiment of the present invention. The array 300 includes unit cell resonators in a two-dimensional pattern defined by rows and columns. By way of example, row "R1" is labeled, as are columns "C1" and "C2." In this regard, a single unit cell resonator, similar to unit cell resonator 200 shown in FIG. 2, occupies a location defined by the intersection of row "R1" and column "C1," with an additional unit cell resonator occupying a location in row "R1" but under column "C2." A variety of such arrangements are possible, using different geometrical shapes and further adding a third dimension (e.g., where unit cell resonators, or arrays of unit cell resonators, are stacked).

In one implementation, the number of holes between defect locations in the array 300 is increased. For instance, as shown, there are two holes between adjacent defect locations (as defect location 218). The number of holes between these locations can be increased by separating adjacent unit cell resonators by a row or column of holes. Referring to columns C1 and C2, an additional column of holes inserted between these columns would increase the distance between defect locations in adjacent unit cells in each column and thereby reduce the coupling between individual resonators. This approach may be implemented to make the coupled-quadrupole band flatter; e.g., the group velocity of light passing through the array 300 is reduced.

Figure 4:
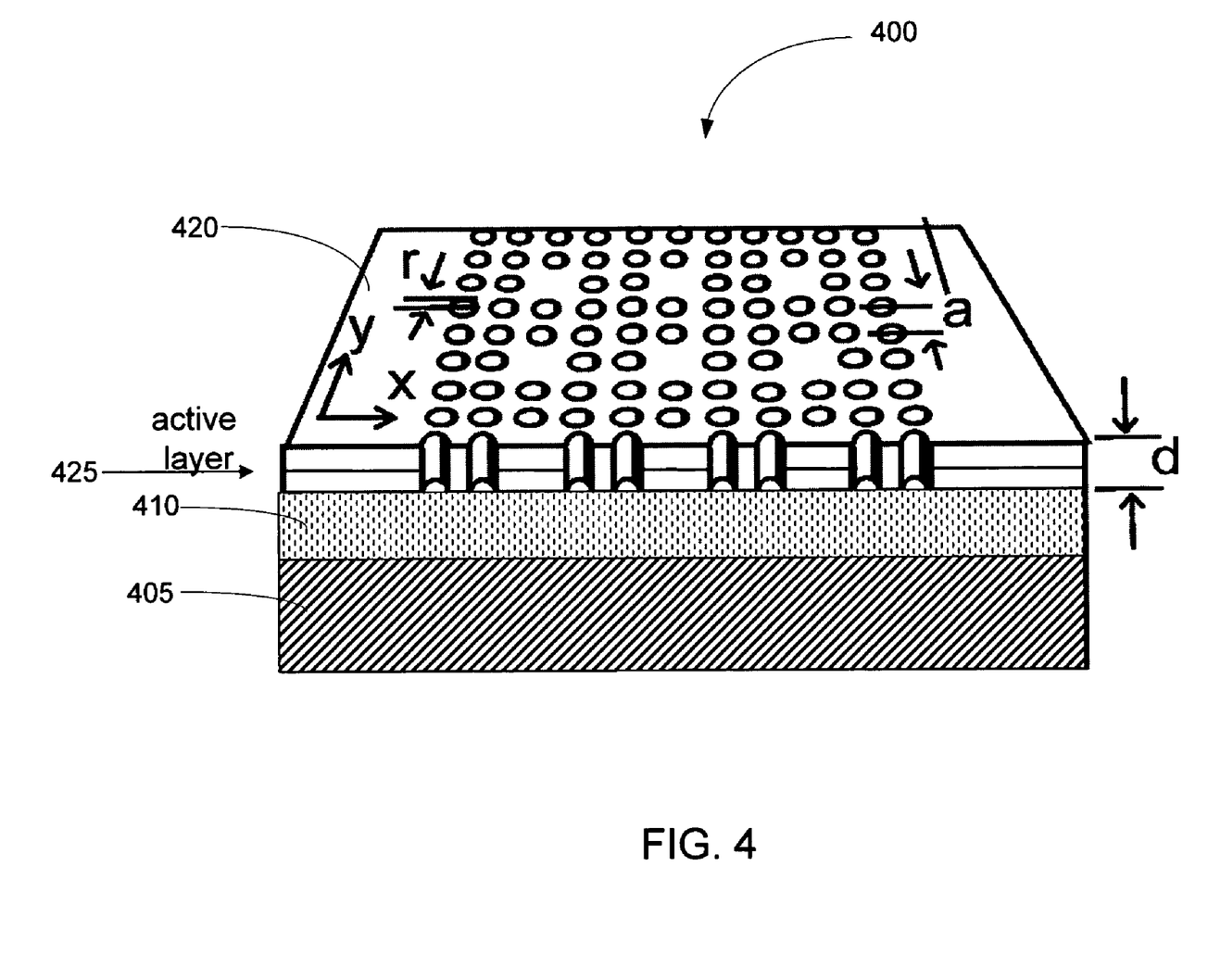
FIG. 4 shows a cross-sectional view of a photonic crystal resonator with an InP substrate, according to another example embodiment of the present invention.

FIG. 4 shows a cross-sectional view of a photonic crystal resonator 400 with a substrate 405, according to another example embodiment of the present invention. The resonator 400 is similar to the resonator 100 shown in FIG. 1, but without an undercut region as shown between the membrane 120 and the substrate 205. Various dimensions including a membrane thickness (d) hole radius (r) and spacing (a) are shown as in FIG. 1. Here, a substrate 405 is separated from a membrane layer 420 by a low refractive index material 410 such as an oxide-containing material or air. The membrane layer 420 includes an array arrangement of holes and, at periodic intervals, locations without holes for facilitating the selective passing of light as discussed above. This approach may be implemented, for example, with laser and/or sensor applications.

The membrane layer 420, substrate 405 and low refractive index material 410 may be made of a variety of materials. In one instance, one or both of the membrane layer 420 and substrate 405 are made of silicon. In another instance, the low refractive index material 410 is made of silicon dioxide. In another instance, the membrane layer 420 includes InGaAs with an embedded active layer 425 (e.g., as InGaAsP quantum wells and/or InAs quantum dots) at the center of the membrane layer, with the substrate 405 including InP and the low refractive index material 410 including one or more of air, an oxide, an a non-undercut InP material.

Figure 5:
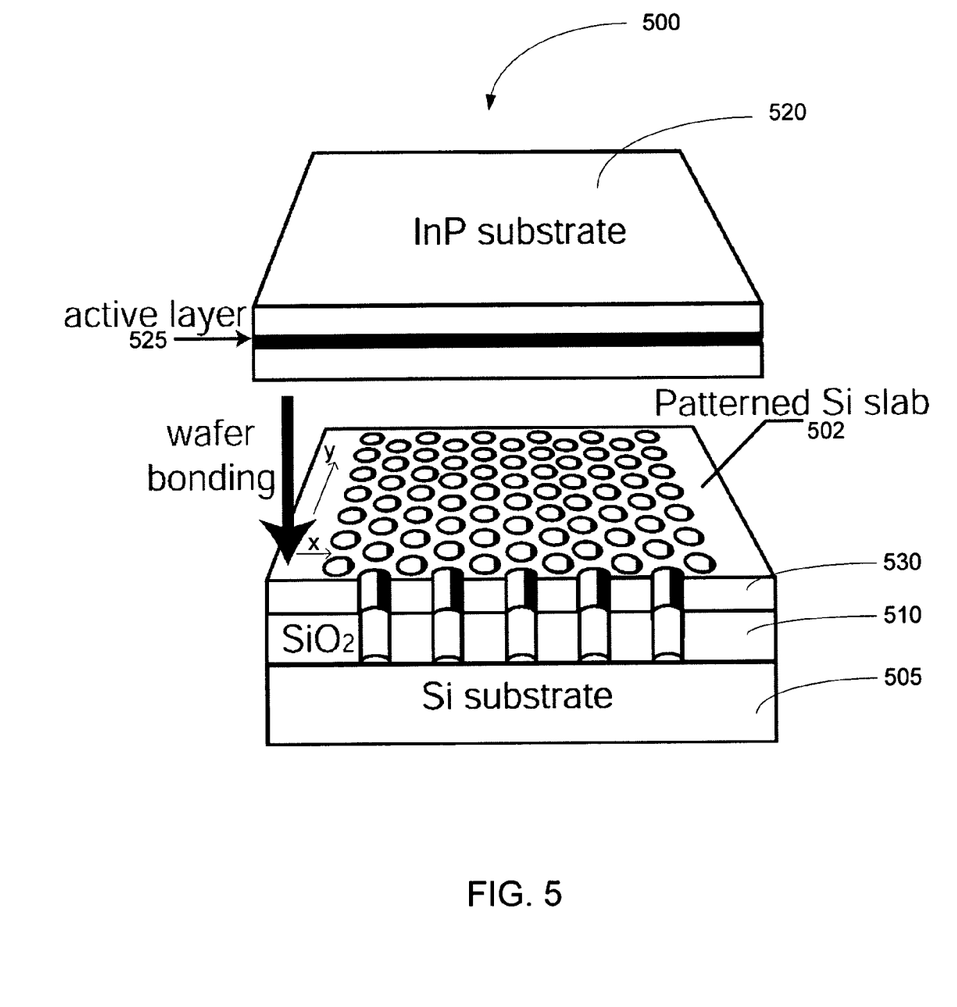
FIG. 5 shows a cross-sectional view of a photonic crystal resonator array laser at a stage of manufacture, with active material wafer bonded to a photonic crystal structure, according to another example embodiment of the present invention.

FIG. 5 shows a cross-sectional view of a photonic crystal resonator array 500 at a stage of manufacture, according to another example embodiment of the present invention. An InP-based (e.g., InGaAs) substrate 520 having an active layer 525 (e.g., InGaAsP quantum wells) is shown in a position for bonding to a silicon-on-insulator (SOI) arrangement 502, having a silicon substrate 505 separated from an upper silicon layer 530 (e.g., epitaxial silicon) by an insulative layer 510. The insulative layer 510 includes one or more of a variety of materials, such as $SiO_2$ (shown) or other materials characterized by a low refractive index. Bonding may be carried out as shown by the arrow labeled "wafer bonding," with the InP-based substrate being bonded onto the upper silicon layer 530. The upper silicon layer 530 and the insulative layer 510 are patterned to form an array of holes extending from an upper surface of the silicon layer 530 and into the insulative layer 510. However, in various instances, the insulating layer 510 is not necessarily patterned. In addition, although the pattern of holes shown in FIG. 5 corresponds to a hexagonal photonic crystal lattice without defects, the same CPCRA as shown in FIG. 4 can also be implemented with the approach shown in FIG. 5. In this regard, hole sizes are periodically modified (or holes are eliminated) in both x and y directions to form a CPCRA. The embodiment shown in FIG. 5 can be used, for example, to implement light sources (such as lasers) that are compatible with silicon-based optoelectronics.

Figure 6:
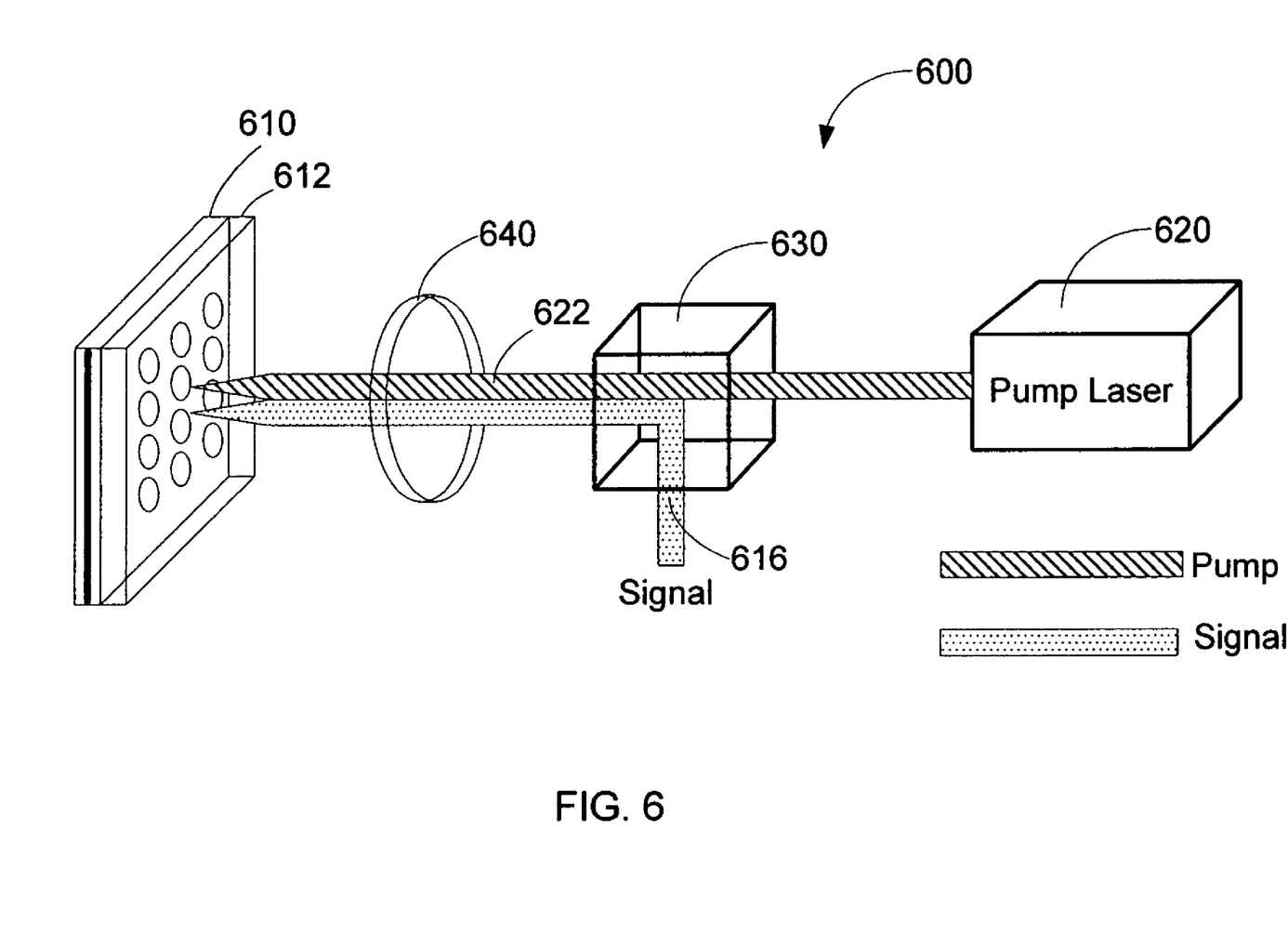
FIG. 6 shows an active CPCRA sensor with an InP substrate patterned with a resonator array, according to another example embodiment of the present invention.

FIG. 6 shows an active CPCRA sensor 600 with an InP CPCRA 610 having an InP substrate patterned with an array of resonators, according to another example embodiment of the present invention. A pump laser 620 is used to stimulate the InP CPCRA 610 with pumping laser light 622 that is passed through a beamsplitter 630 and a lens arrangement 640 to stimulate the InP substrate. Generally, the pumping laser light hits the InP CPCRA 610, scatters along the plane of the CPCRA and interacts with an active layer (e.g., quantum dots or quantum wells) embedded inside of it. The light is absorbed by the active layer, which generates electrons and holes (electron-hole pairs) in response to the light. When the electron-hole pairs recombine, photons are emitted (e.g., at a different wavelength and corresponding color and direction than the pumping laser light 622). The emitted photons (light) emit along the plane of the InP CPCRA 610 and are coupled to a vertical direction towards the lens arrangement 640. Implemented as a sensor, the InP CPCRA 610 responds to the pumping laser light 622 by generating light that is passed through the lens arrangement 640, the beamsplitter 630 and output as signal 616. In connection with this embodiment, it has been discovered that the lasing wavelength (i.e., a wavelength of emitted light 616) is sensitive to the refractive index of the layer 612 deposited on top of the structure; therefore, various bio-chemical reactions in the layer 612 can be monitored by monitoring the wavelength of the emitted light.

The coated material 612 can include one or more layers, depending upon the desirable application. For example, when implemented for biological sensing, the InP CPCRA 610 is coated with first material such as an antibody, hormone or enzyme. The InP CPCRA 610 is then coated with a second material, such as a corresponding antigen for antibody sensing, a receptor for hormone sensing or a particular substrate for enzyme sensing. With these types of approaches, the interaction of nucleotides with complementary nucleotides, the interaction of biotinylated albumin serum with streptavidin (protein molecule) and others can be sensed. For example, by observing an optical response (relative to wavelength and time), specific parameters relating to the interaction (i.e., kinetic rates of the interaction) can be detected.

In another implementation, characteristics of a coated material 612 (e.g., chemical or biological material) are determined. For example, the refractive index, molar concentration (with known refractive index) or thickness (also with known refractive index) of the coated material 612 can be determined. In connection with this implementation, the operating wavelength of the structure shown in FIG. 6 has been discovered to be highly sensitive to the refractive index of the medium surrounding the CPCRA sensor 600 (i.e., deposited biological or chemical material 612), as described above. A chart for each unknown property (refractive index, molar concentration, thickness) is extracted as function of wavelength for a particular application (and sensor 600). The material 612 is coated and the wavelength of light (as signal 616) is detected. The detected wavelength is correlated to the chart to determine one or more unknown properties of the material 612.

Figure 7:
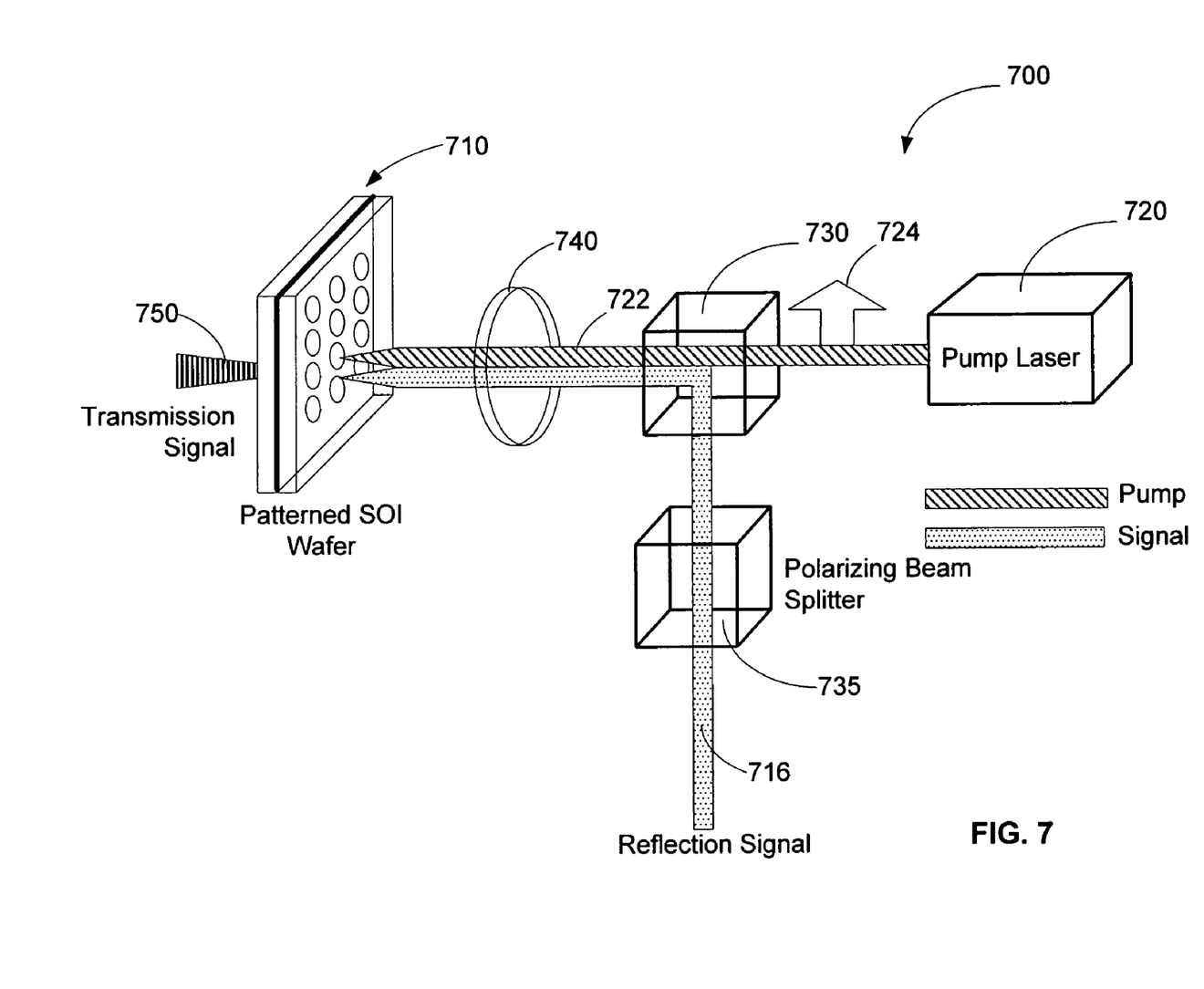
FIG. 7 shows a passive CPCRA sensor, according to another example embodiment of the present invention.

FIG. 7 shows a passive CPCRA sensor system 700, according to another example embodiment of the present invention. The system 700 includes an SOI-based CPCRA 710 that responds to light by altering a reflection or transmission type signal (i.e., a peak or dip occurs in the transmitted or reflected signal as the wavelength of an excitation beam changes). The CPCRA 710 may be implemented similarly to the CPCRA shown in one of the above-discussed figures, such as FIG. 4 or 5, and is optionally coated with a material as discussed with FIG. 6. A pump laser 720 generates a polarized pumping laser light 722 that is passed to the CPCRA 710 via a beamsplitter 730 and a lens arrangement 740. A portion 724 of the pumping light 722 from the pump laser 720 is optionally used for synchronization, reference or other processing purposes.

The CPCRA 710 generates an output signal in a manner similar to that shown in FIG. 6, with an output (e.g., "reflected" signal of opposite polarization relative to the excitation) 716 passed through the beamsplitter 730 as well as a polarizing beamsplitter 735. A transmission signal 750 and the reflection signal of opposite polarization 716 are measured from the CPCRA 710. These signals (750 and 716) exhibit changes (i.e., peaks or dips) as a function of the wavelength of the pump laser 722. The wavelength at which these peaks and dips occur is related to the refractive index of the layer deposited on top of the CPCRA; therefore, variations in the surrounding refractive index are detected and used to monitor reactions including, e.g., biochemical reactions as described above.

Figure 8:
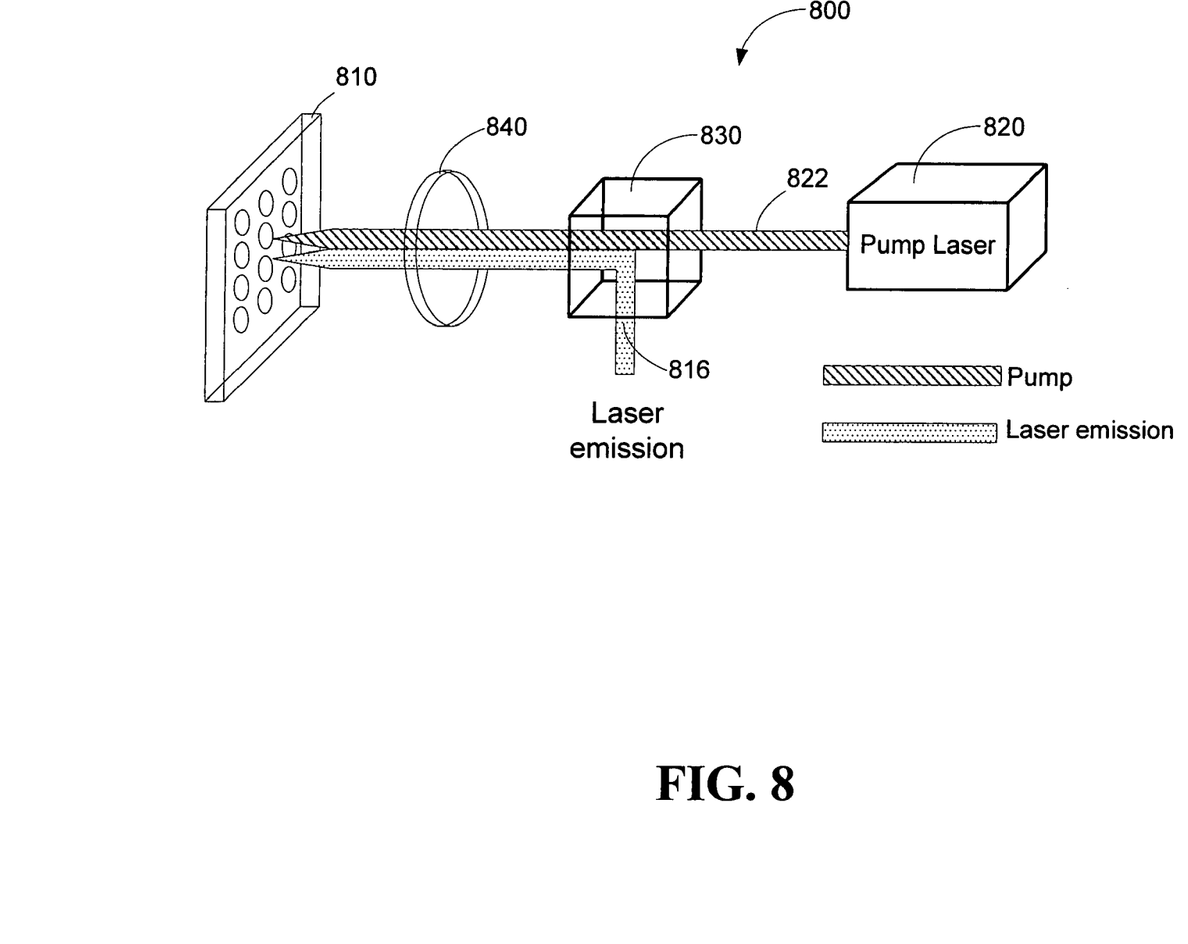
FIG. 8 shows an optically pumped CPCRA laser, according to another example embodiment of the present invention.

FIG. 8 shows an optically pumped CPCRA laser arrangement 800, according to another example embodiment of the present invention. The laser arrangement 800 includes a CPCRA 810 implemented with a substrate such as an InP-type substrate. A pump laser 820 generates pumping laser light 822 that is passed through a beamsplitter 830 and a lens arrangement 840 to the CPCRA 810. The CPCRA 810 responds to the pumping laser light 822 by generating photons, e.g., as discussed above with electron-hole pair generation. The photons emit generally perpendicular to the plane of the CPCRA 810, passed through the lens arrangement 840 and the beamsplitter 830 and output as laser emission 816.

Figure 9:
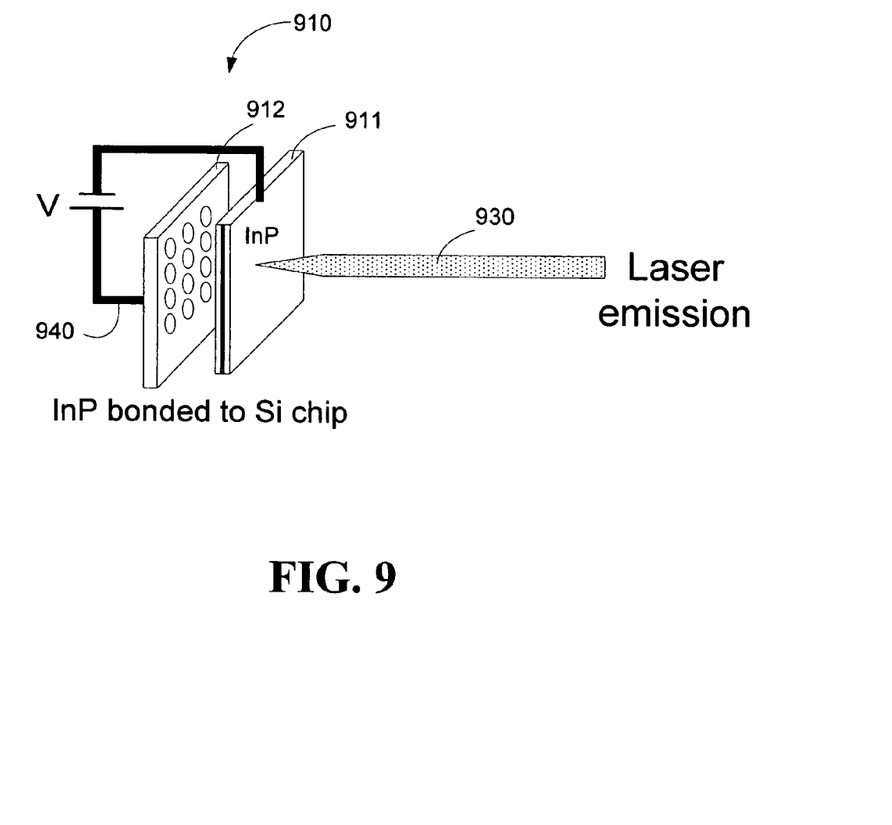
FIG. 9 shows one possible implementation for an electrically pumped CPCRA laser such as that shown in FIG. 8 with an InP substrate bonded to a silicon chip, according to another example embodiment of the present invention.

FIG. 9 shows an InP-based CPCRA 910 for application as an electrically pumped CPCRA, according to another example embodiment of the present invention. The CPCRA 910 includes an InP substrate 911 bonded to a silicon chip 912, shown apart for illustrative purposes. An electrical pumping circuit 940 is adapted to apply electrical pumping signals to the CPCRA 910. In response to the electrical pumping, the CPCRA 910 generates photons that are emitted as laser emission 930. In various applications, wafer-bonding of InP to silicon is implemented to facilitate the construction of lasers that are compatible with silicon-based optoelectronics. In another implementation, an electrically pumped InP laser includes an approach involving doped layers and electrodes, similar to that shown in FIG. 4.

While the present invention has been described with reference to several particular example embodiments, those skilled in the art will recognize that many changes may be made thereto without departing from the spirit and scope of the present invention. For example, various resonator shapes and arrangements can be implemented with CPCRAs, using the approaches discussed above, such as by arranging a hexagonal or other shape of defect structure for a lattice (relative, e.g., to the square lattice in FIG. 1). In other applications, rods in square or hexagonal arrays of dielectric rods embedded in air are periodically modified to achieve low group velocity as discussed herein. In this regard, CPCRAs can be formed by periodically modifying unit cells in any two or three dimensional photonic crystal array, in connection with various example approaches and embodiments. In addition, the various example embodiments and implementations discussed herein can be implemented with a variety of devices and approaches, such as those involving one or more of: waveguides, filters, lasers and optical integrated circuits. For example approaches and embodiments that may be implemented in connection with one or more of the embodiments discussed herein, reference may be made to the attached Appendices A and B, respectively entitled "Experimental demonstration of the slow group velocity of light in two-dimensional coupled photonic crystal microcavity arrays" and "Polarization control and sensing with two-dimensional coupled photonic crystal microcavity arrays." Furthermore, for general information regarding resonator arrays and for specific information regarding applications to which one or more of the various example embodiments and implementations shown and discussed herein may be applied with or to, reference may be made to Hatice Altug and Jelena Vuckovic, "Two-dimensional coupled photonic crystal resonator arrays," Applied Physics Letters, Volume 84, Number 2, 12 Jan. 2004, which is fully incorporated herein by reference.

What is claimed is:

1. A photonic crystal device comprising:
   a substrate;
   a photonic crystal resonator array including a membrane having an arrayed pattern of hole locations including a plurality of holes, each hole defined by the membrane, periodic ones of the hole locations having an inconsistency; and
   the photonic crystal resonator array being adapted, with the substrate, to control the group velocity of light propagating in an arbitrary crystalline direction of the photonic crystal resonator array.

2. The device of claim 1, wherein the photonic crystal resonator array is adapted, with the substrate, to control the group velocity of light propagating in a plurality of arbitrary crystalline directions of the photonic crystal resonator array.

3. The device of claim 1, wherein the photonic crystal resonator array is adapted, with the substrate, to control the group velocity of light propagating in all crystalline directions of the photonic crystal resonator array.

4. The device of claim 1, wherein the membrane is suspended over the substrate.

5. The device of claim 1, wherein the membrane has a consistently arranged hole opening therein at a majority of the patterned hole locations and wherein the periodic ones of the hole locations having an inconsistency include hole locations that are inconsistent, relative to the majority of the patterned hole locations.

6. The device of claim 5, wherein the membrane has, at certain of the periodic ones of the hole locations having an inconsistency, hole openings of a diameter that is inconsistent with the diameter of the hole openings at the majority of the patterned hole locations.

7. The device of claim 5, wherein the periodic ones of the hole locations having an inconsistency include hole locations that are devoid of a hole extending through the membrane.

8. The device of claim 5, wherein the periodic ones of the hole locations having an inconsistency are configured and arranged in at least one of periodicity, number and size to control the group velocity of light propagating in an arbitrary crystalline direction of the photonic crystal resonator array.

9. The device of claim 5, wherein the membrane is configured to control a coupled defect band of the photonic crystal resonator array as a function of a number of photonic crystal periods between the hole locations having an inconsistency.

10. The device of claim 5, wherein the membrane is configured to control a band slope and frequency of the photonic crystal resonator array as a function of a number of photonic crystal periods between the hole locations having an inconsistency.

11. The device of claim 1, further comprising a supporting structure on the substrate and adapted to suspend the photonic crystal resonator array over the substrate.

12. The device of claim 11, wherein the membrane is a silicon membrane and wherein the supporting structure having a relatively low refractive index that, together with the silicon membrane, form a silicon-on-insulator (SOI) structure.

13. The device of claim 1, wherein the membrane is disposed on the substrate.

14. The device of claim 13, wherein the photonic crystal resonator array includes the membrane and the substrate.

15. The device of claim 1, wherein the membrane is patterned with a repeating pattern of the hole locations, a plurality of the hole locations having openings of consistent arrangement thereat, selected other ones of the hole locations arranged inconsistently, relative to the consistent opening locations; and wherein the resonator array is adapted, with the substrate, to control the group velocity of light propagating in an arbitrary crystalline direction of the photonic crystal resonator array.

16. The device of claim 1, wherein the arrayed pattern of hole locations includes a repeated pattern of hole locations, the repeated pattern including a center hole location surrounded by boundary hole locations, each boundary hole location having a consistent hole opening and the center hole location having structure that is inconsistent with the hole opening.

17. The device of claim 16, wherein the repeated pattern includes a single center hole location that is immediately adjacent each of the boundary hole locations such that no boundary hole location of the repeated pattern is disposed between the center hole location and another boundary hole location of the repeated pattern.

18. A laser comprising:
a photonic crystal resonator array including a membrane having an arrayed pattern of hole locations including a plurality of holes, each hole defined by the membrane, periodic ones of the hole locations having an inconsistency;
a substrate arrangement including the photonic crystal resonator array;
an excitation source adapted to excite a portion of the photonic crystal resonator array into emitting photons; and
wherein the photonic crystal resonator array is configured and arranged to couple the emitted photons to output laser light.

19. The laser of claim 18, wherein the excitation source is an electrical excitation source adapted to electrically stimulate the substrate.

20. The laser of claim 18, wherein the excitation source is a pumping laser adapted to optically stimulate the substrate.

21. A sensor comprising
a photonic crystal resonator array including a membrane having an arrayed pattern of hole locations including a plurality of holes, each hole defined by the membrane, periodic ones of the hole locations having an inconsistency;
a substrate arrangement including the photonic crystal resonator array, the substrate arrangement being configured and arranged for generating light as a function of a stimulus, wherein the photonic crystal resonator array is adapted to couple and pass the generated light; and
a light detector arranged for detecting light from the photonic crystal resonator array generated as a function of the stimulus.

22. An optical delay device comprising:
a photonic crystal resonator array including a membrane having an arrayed pattern of hole locations including a plurality of holes, each hole defined by the membrane, periodic ones of the hole locations having an inconsistency;
a light source; and
a substrate arrangement including the photonic crystal resonator array, the substrate arrangement being configured and arranged to couple and pass the generated light at a delayed time, relative to uncoupled light from the light source.

23. The optical delay device of claim 22, wherein the photonic crystal resonator array is configured and arranged for refractive index modulation for tuning the group velocity of light passed to the light detector.

24. The optical delay device of claim 23, wherein the photonic crystal resonator array is adapted for refractive index modulation for selectively storing and passing optical pulses.

25. The optical delay device of claim 22, further comprising a light detector arranged for detecting the light coupled and passed with the photonic crystal resonator array.

26. A photonic crystal device comprising:
a substrate;
a photonic crystal resonator array including a membrane having an arrayed pattern of hole locations including a plurality of holes, each hole defined by the membrane, periodic ones of the hole locations having an inconsistency; and
the photonic crystal resonator array being adapted, with the substrate, to inhibit the passing of selected wavelengths of light through the photonic crystal.

27. A method for manufacturing a photonic crystal resonator array, the method comprising:
forming a membrane of crystalline material having an arrayed pattern of hole locations including a plurality of holes, each hole defined by the membrane, periodic ones of the hole locations having an inconsistency; and
wherein the arrayed pattern of hole locations in the membrane form an array of evanescently-coupled resonators, each resonator including a plurality of holes arranged around an inconsistent hole location to control, via the evanescent coupling, the group velocity of light propagating in an arbitrary crystalline direction of the crystalline material.

28. The method of claim 27, wherein forming the membrane includes selecting a distance between the periodic ones of the hole locations having an inconsistency as a function of a frequency of light to be passed by the membrane.

29. The method of claim 27, wherein forming a membrane of crystalline material having an arrayed pattern of hole locations including a plurality of holes includes forming holes at selected ones of the hole locations having a reduced hole radius, relative to other holes at the hole locations, the reduced hole radius selected as a function of a frequency of light to be passed by the membrane.

30. The device of claim 1, wherein adjacent resonators in the photonic crystal resonator array are coupled via evanescent field coupling.

31. The device of claim 1, wherein the resonator array includes an array of magnetically-coupled resonators, each resonator including one of the inconsistent hole locations, with hole locations arranged around said inconsistent hole locations to mitigate the propagation of light to adjacent resonators.

32. The device of claim 31, wherein each resonator exhibits a resonant frequency that falls within the photonic bandgap of the surrounding resonator array structure.

* * * * *

UNITED STATES PATENT AND TRADEMARK OFFICE
CERTIFICATE OF CORRECTION

| | |
|---|---|
| PATENT NO. | : 7,206,488 B1 |
| APPLICATION NO. | : 10/946774 |
| DATED | : April 17, 2007 |
| INVENTOR(S) | : Altug et al. |

It is certified that error appears in the above-identified patent and that said Letters Patent is hereby corrected as shown below:

Col. 1, paragraph 1 between lines 3 and 4, please add: --This invention was made with Government support under contract DAAD19-03-1-0199 awarded by the Department of the Army. The Government has certain rights in this invention.--

Signed and Sealed this

Ninth Day of September, 2008

JON W. DUDAS
*Director of the United States Patent and Trademark Office*